US012793766B2

(12) United States Patent
Su

(10) Patent No.: US 12,793,766 B2
(45) Date of Patent: Nov. 10, 2026

(54) SENSE AMPLIFIER, OPERATION METHOD FOR SENSE AMPLIFIER, AND MEMORY

(71) Applicant: CXMT Corporation, Hefei City (CN)

(72) Inventor: Hsin-Cheng Su, Hefei City (CN)

(73) Assignee: CXMT Corporation, Hefei City (CN)

( * ) Notice: Subject to any disclaimer, the term of this patent is extended or adjusted under 35 U.S.C. 154(b) by 72 days.

(21) Appl. No.: 18/953,024

(22) Filed: Nov. 19, 2024

(65) Prior Publication Data

US 2025/0349346 A1 Nov. 13, 2025

Related U.S. Application Data

(63) Continuation of application No. PCT/CN2024/125704, filed on Oct. 18, 2024.

(30) Foreign Application Priority Data

May 10, 2024 (CN) ......................... 202410579722.0

(51) Int. Cl.
*G11C 7/08* (2006.01)
*G11C 11/4091* (2006.01)
*G11C 11/4094* (2006.01)

(52) U.S. Cl.
CPC ...... *G11C 11/4091* (2013.01); *G11C 11/4094* (2013.01); *G11C 7/08* (2013.01)

(58) Field of Classification Search
CPC .............................. G11C 7/08; G11C 11/2273
See application file for complete search history.

(56) References Cited

U.S. PATENT DOCUMENTS

| | | | |
|---|---|---|---|
| 11,276,438 B2 | 3/2022 | Wang | |
| 2021/0366523 A1 | 11/2021 | Wang | |
| 2023/0223072 A1 | 7/2023 | Chi | |
| 2024/0290376 A1* | 8/2024 | Zhang | ................. G11C 11/2273 |

FOREIGN PATENT DOCUMENTS

| | | |
|---|---|---|
| CN | 115457997 A | 12/2022 |

OTHER PUBLICATIONS

International Search Report and written opinion in application No. PCT/CN2024/125704, mailed on Jan. 21, 2025.
The Extended European Search Report in application No. 24936197, mailed on Aug. 27, 2026.

* cited by examiner

*Primary Examiner* — Jason Lappas
(74) *Attorney, Agent, or Firm* — Syncoda LLC; Feng Ma

(57) ABSTRACT

The sense amplifier includes: a first transistor electrically connected between a first power supply node and a complementary readout bit line; a second transistor electrically connected between a second power supply node and a readout bit line; the third transistor electrically connected between the complementary readout bit line and a third power supply node; the fourth transistor electrically connected between the readout bit line and a fourth power supply node; and a first calibration transistor connected between the complementary readout bit line and the control end of the third transistor. The first power supply node and the second power supply node are connected to a first power supply voltage through different switch elements respectively; the third power supply node and the fourth power supply node are connected to a second power supply voltage through different switch elements respectively.

10 Claims, 6 Drawing Sheets

SENSE AMPLIFIER, OPERATION METHOD FOR SENSE AMPLIFIER, AND MEMORY

CROSS-REFERENCE TO RELATED APPLICATIONS

This is a continuation of International Patent Application No. PCT/CN2024/125704 filed on Oct. 18, 2024, which claims priority to Chinese Patent Application No. 202410579722.0, filed on May 10, 2024. The disclosures of the above-referenced applications are hereby incorporated by reference in their entirety.

BACKGROUND

During the operation of a sense amplifier (SA), an insufficient sensing margin of the sense amplifier may cause errors in the process of sense amplifying, thereby causing errors in data reading and writing. At present, offset-cancellation sense amplifiers (OCSAs) are mainly used in the industry to compensate for sensing margin losses caused by device mismatch, so as to improve the sensing margin of the sense amplifier.

The sensing margin losses caused by device mismatch of the sense amplifier are compensated by the offset-cancellation sense amplifiers. However, as device mismatch is only one factor contributing to the sensing margin losses, the reduction of the sensing margin loss achieved by addressing device mismatch is limited. In addition, in advanced manufacturing processes or product architecture designs, the proportion of other factors contributing to sensing margin losses will also be increased.

SUMMARY

Embodiments of the present application relate to the field of memories, and in particular, to a memory including a sense amplifier.

Embodiments of the present application provide a sense amplifier, an operation method for the sense amplifier, and a memory including the sense amplifier, which are at least beneficial to solving the problem of insufficient sensing margin of sense amplifiers.

According to some embodiments of the present application, in one aspect, the embodiments of the present application provide a sense amplifier. The sense amplifier includes:

- a first transistor electrically connected between a first power supply node and a complementary readout bit line, a control end of the first transistor being connected to a control end of a third transistor;
- a second transistor electrically connected between a second power supply node and a readout bit line, a control end of the second transistor being connected to a control end of a fourth transistor;
- the third transistor electrically connected between the complementary readout bit line and a third power supply node;
- the fourth transistor electrically connected between the readout bit line and a fourth power supply node; and
- a first calibration transistor connected between the complementary readout bit line and the control end of the third transistor,
- where the first power supply node is connected to a first power supply voltage through a first switch element; the second power supply node is connected to the first power supply voltage through a second switch element; the third power supply node is connected to a second power supply voltage through a third switch element; the fourth power supply node is connected to the second power supply voltage through a fourth switch element.

According to some embodiments of the present application, in another aspect, the embodiments of the present application provide an operation method for a sense amplifier. The operation method is used for operating the sense amplifier as described in the first aspect. The operation method includes:

- performing a pre-charging operation to pre-charge the bit line, the readout bit line, the complementary bit line, and the complementary readout bit line to a preset voltage;
- performing a calibration operation to calibrate voltages of an input end and an output end of an inverter formed by the first transistor and the third transistor to the same voltage;
- performing a charge sharing operation to enable a memory cell to share charge with the bit line;
- performing a pre-amplifying operation to transmit the voltage of the input end of the inverter formed by the first transistor and the third transistor to the complementary bit line; and
- performing a sense amplifying operation to amplify a voltage difference between the bit line and the complementary bit line.

According to some embodiments of the present application, in another aspect, the embodiments of the present application provide an operation method for a sense amplifier. The operation method is used for operating a sense amplifier including a first inverter and a second inverter cross-coupled with each other, an input end of the first inverter being connected to a bit line and an input end of the second inverter being connected to a complementary bit line. The operation method includes:

- performing a pre-charging operation to pre-charge all internal nodes of the sense amplifier to a preset voltage;
- performing a calibration operation to calibrate voltages of the input end and an output end of the first inverter to the same voltage;
- performing a charge sharing operation to enable a memory cell to share charge with the bit line;
- performing a pre-amplifying operation to enable the voltage of the input end of the first inverter to be pre-amplified and transmitted to the complementary bit line; and
- performing a sense amplifying operation to amplify a voltage difference between the bit line and the complementary bit line.

According to some embodiments of the present application, in another aspect, the embodiments of the present application also provide a memory. The memory includes a plurality of sense amplifiers according to the first aspect and a plurality of memory cells, where the plurality of sense amplifiers are connected to the plurality of memory cells through bit lines.

The technical solutions provided by the embodiments of the present application at least have the following advantages: The sense amplifier of the present application includes two independently controllable inverters, and the input end and the output end of the first inverter are connected through the first calibration transistor. This circuit configuration enables the shorting of the inverter's input and output ends, allowing for the utilization of the inverter's switching point. This switching point enables further amplification of the sensed voltage on the bit line, allowing the minute charge sharing voltage value to be amplified. As a result, the sensing margin of the sense amplifier is increased, contributing to the improvement in chip yield.

BRIEF DESCRIPTION OF THE DRAWINGS

One or more embodiments are illustrated by images in corresponding drawings, and these exemplary explanations are not to be construed as limiting the embodiments. Unless expressly stated otherwise, the images in the drawings do not constitute a proportion limitation.

DETAILED DESCRIPTION

Figure 1:
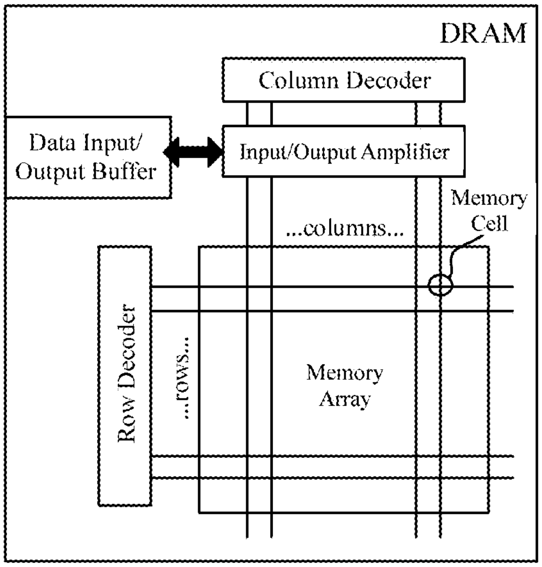
FIG. 1 is a schematic structural diagram of a memory.

Exemplary embodiments of the present application will be described in detail below with reference to the drawings, such that those skilled in the art can easily practice the present application. As those skilled in the art will recognize, the described embodiments may be modified in various different ways, all without departing from the spirit or scope of the present application. For example, the exemplary embodiments provided herein are considered to be capable of being combined in whole or in part for implementation. Specifically, an element described in a particular exemplary embodiment, even if not described in another exemplary embodiment, can be understood as a description relating to another exemplary embodiment, unless a contrary or contradictory description is provided therein.

Throughout this specification, when any part is referred to as being "connected" to another part, it includes the case where any part and another part are "indirectly connected" to each other with other parts interposed there between and the case where any part and another part are "directly connected" to each other. For example, it should be understood that when an element is referred to as being "connected" or "coupled" to another element, or "on" another element, it can be directly connected or coupled to another element or directly on another element, or an intervening element may be present. In contrast, when an element is referred to as being "directly connected" or "directly coupled" to another element, or "in contact with" another element, no intervening elements are present at the point of contact (except for connecting lines such as metal wires). Furthermore, "electrically connected" conceptually includes being physically connected and being physically disconnected.

It can be understood that when terms such as "first" and "second" are used to refer to an element, the element is not so limited. They may be used only for the purpose of distinguishing one element from another and may not limit the order or importance of the elements. In some cases, the first element may be termed the second element without departing from the scope of the claims set forth herein. Similarly, the second element may also be referred to as the first element.

The voltage (or the amount of charge) obtained by the sense amplifier during charge sharing, after accounting for all sensing margin losses, leaves a certain margin that ensures successful data sensing amplification. This margin is referred to as the sensing margin. Sensing margin losses of a sense amplifier include recovery loss, sharing loss, and losses caused by array noise or device mismatch. As processes evolve and device dimensions shrink, a significant portion of sensing margin loss is caused by device mismatch (such as PMOS transistor pair mismatch and NMOS transistor pair mismatch). Existing offset-cancellation sense amplifiers (hereinafter referred to as OCSAs) can reduce the margin loss caused by device mismatch, but this is only part of the sensing margin loss. Even with improvements, there remains a high probability of data errors, which slows the improvement in memory yield. Moreover, for advanced processes and new product architecture designs (such as 3D-DRAM), device mismatch is no longer the most critical factor affecting the margin loss. For example, the proportion of the sensing margin loss caused by array noise is increasing, which increasingly weakens OCSA's ability to optimize sensing margin loss.

Based on this, a new sense amplifier structure and an operation method for the sense amplifier are provided by the present application. The sense amplifier structure includes two independently controllable inverters, and the input end and the output end of the first inverter are connected through the first calibration transistor. This circuit configuration enables the shorting of the first inverter's input and output ends, allowing for the utilization of the inverter's switching point. This switching point enables further amplification of the sensed voltage on the bit line, allowing the minute charge sharing voltage value and the voltage (the amount of charge) obtained during the charge sharing to be amplified. As a result, the sensing margin of the sense amplifier is increased, contributing to the improvement in chip yield.

The embodiments of the present application will be described in detail below with reference to the drawings. Those of ordinary skill in the art can understand that, in the embodiments of the present application, numerous technical details are set forth in order to enable readers to better understand the present application. However, the technical solutions claimed by the present application can also be implemented even without these technical details and the various changes and modifications based on the following embodiments.

Figure 2:
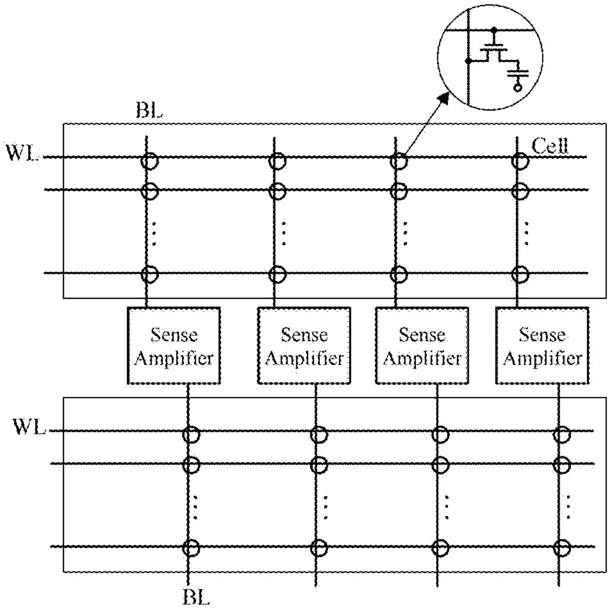
FIG. 2 is a schematic structural diagram of a memory array.

Taking a dynamic random access memory (DRAM) as an example, as shown in FIG. 1, a DRAM memory chip includes a data input/output buffer, an input/output amplifier, a row decoder, a column decoder, and a memory array. The data input/output buffer belongs to the peripheral area circuit, while the input/output amplifier, the row decoder, the column decoder, and the memory array belong to the array area circuit. As shown in FIG. 2, the memory array is mainly composed of a memory array tile (MAT), a sense amplifier array composed of a plurality of sense amplifiers, and a sub-word line driver (SWD, not shown). The memory array tile includes word lines WL, bit lines BL, and memory cells Cell arranged in an array. In the memory array, the word lines extend in the row direction and the bit lines extend in the column direction, and the memory cells of the memory array are located at intersections of the word lines and the bit lines.

Each row address line is connected to a plurality of column address lines and memory cells, and a sense amplifier is required to amplify a weak activation signal on the column address lines for detection of this signal. FIG. 2 illustrates a double-ended sense amplifier. One end of the sense amplifier is connected to one bit line BL of one memory array tile and the other end is connected to another bit line BL of another memory array tile. The signal to be read is amplified by comparing the voltage difference between the two bit lines. It should be understood that the technical solutions of the present application may also be used in a single-ended sense amplifier if without conflicting with the inventive concept of the present application.

FIG. 2 further illustrates the specific structure of the memory cells. A DRAM memory cell with one transistor and one capacitor (1T1C) is exemplified in FIG. 2. It should be understood that other types of memory cells, such as non-DRAM memory cells or DRAM memory cells with, e.g., 2T0C, are also applicable to the present disclosure.

Figure 3:
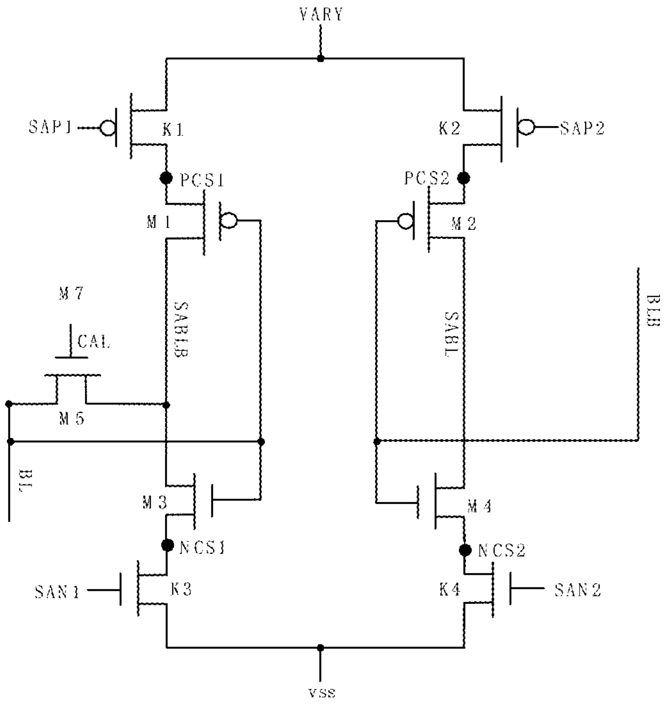
FIG. 3 is a schematic diagram of a circuit structure of a sense amplifier provided according to an embodiment of the present application.

FIG. 3 is a schematic structural diagram of a sense amplifier provided according to an embodiment of the present application. As shown in FIG. 3, the sense amplifier includes: a first transistor M1 electrically connected between the first power supply node PCS1 and the complementary readout bit line SABLB, the control end of the first transistor being connected to the control end of the third transistor; a second transistor M2 electrically connected between the second power supply node PCS2 and the readout bit line SABL, the control end of the second transistor being connected to the control end of the fourth transistor; a third transistor M3 electrically connected between the complementary readout bit line SABLB and the third power supply node NCS1; a fourth transistor M4 electrically connected between the readout bit line SABL and the fourth power supply node NCS2; and a first calibration transistor M5 connected between the complementary readout bit line SABLB and the control end of the third transistor. The first power supply node PCS1 is connected to the first power supply voltage through the first switch element K1; the second power supply node PCS2 is connected to the first power supply voltage through the second switch element K2; the third power supply node NCS1 is connected to the second power supply voltage through the third switch element K3; and the fourth power supply node NCS2 is connected to the second power supply voltage through the fourth switch element K4.

In this embodiment, the first transistor M1 and the third transistor M3 may be connected as an inverter, with a gate serving as the input end of the inverter and a drain serving as the output end of the inverter. The second transistor M2 and the fourth transistor M4 may also be connected as an inverter, with a gate serving as the input end of the inverter and a drain serving as the output end of the inverter. To avoid repetitive description, in the following content of this embodiment, the inverter formed by the first transistor M1 and the third transistor M3 is referred to as the first inverter, and the inverter formed by the second transistor M2 and the fourth transistor M4 is referred to as the second inverter.

Referring to FIG. 3, the power supply ends of the first inverter are connected to the first power supply node PCS1 and the third power supply node NCS1; the first power supply node PCS1 is connected to the first power supply voltage through the first switch element K1, and the third power supply node NCS1 is connected to the second power supply voltage through the third switch element K3. The power supply ends of the second inverter are connected to the second power supply node PCS2 and the fourth power supply node NCS2; the second power supply node PCS2 is connected to the first power supply voltage through the second switch element K2, and the fourth power supply node NCS2 is connected to the second power supply voltage through the fourth switch element K4. Therefore, the first to the fourth power supply nodes are independent of each other and may be independently controlled by the first to the fourth switch elements, and thus, the first inverter and the second inverter may be independently controlled to be turned on and off.

The control end of the first switch element receives the first switch signal SAP1, the control end of the second switch element receives the second switch signal SAP2, the control end of the third switch element receives the third switch signal SAN1, and the control end of the fourth switch element receives the fourth switch signal SAN2.

The first power supply voltage may be used to provide a high level, such as a power supply voltage VCC or VDD, or a high level dedicated to the memory array or the sense amplifier, which is not limited herein and is denoted by VARY. The second power supply voltage may be used to provide a low level, such as a ground level and a negative voltage, which is not limited herein and is denoted by VSS.

With further reference to FIG. 3, the first calibration transistor M5 is connected between the complementary readout bit line SABLB and the control end of the third transistor, and thus, the input end and the output end of the first inverter may be shorted. Since the first inverter and the second inverter may be independently controlled to be turned on and off and the input/output ends of the first inverter may be shorted through the first calibration transistor M5, this circuit enables the first inverter to be turned on at a certain phase during the operation of the sense amplifier to perform a calibration operation to calibrate the voltages of the input and output ends to the switching point thereof. In conjunction with the transfer curve of the inverter, the voltage where the input voltage Vin is equal to the output voltage Vout is the switching point voltage of the inverter. According to the transfer curve of the inverter, if the input voltage of the inverter is higher than the switching point, the output voltage may be greatly reduced, and if the input voltage of the inverter is lower than the switching point, the output voltage may be greatly increased. If the voltage of the input end of the first inverter is slightly changed due to the charge sharing operation of the sense amplifier after the calibration operation, the voltage of the output end of the first inverter will be inverted and amplified according to the transfer curve of the inverter, resulting in a relatively significant voltage change. Therefore, in the subsequent operation process, the voltage difference base to be amplified by the sense amplifier is increased and the sensing margin is increased, thereby increasing the success rate of sensing amplification.

It should be noted that, in some embodiments, the sense amplifier is a single-ended sense amplifier and the first inverter is connected to the bit line BL. The bit line is connected to the memory cell to perform a charge sharing operation with the memory cell. In some other embodiments, the sense amplifier is a single-ended sense amplifier and the second inverter is connected to the bit line BL, and alternatively, the first calibration transistor is connected between the input end and the output end of the second inverter. The bit line is connected to the memory cell to perform a charge sharing operation with the memory cell, thereby amplifying the shared voltage through the switching point of the second inverter.

It should be understood that, in some embodiments, the sense amplifier is a double-ended sense amplifier, the first inverter is connected to the bit line BL, and the bit line is connected to the memory cell to perform a charge sharing operation with the memory cell. In some other embodiments, the sense amplifier is a double-ended sense amplifier, the second inverter is connected to the bit line BL, and alternatively or compatibly, a second calibration transistor is connected between the input end and the output end of the second inverter. The bit line is connected to the memory cell to perform a charge sharing operation with the memory cell, thereby amplifying the shared voltage through the switching point of the second inverter.

In some embodiments, the first switch element K1 and the third switch element K3 may be simultaneously turned on and off, and the second switch element K2 and the fourth switch element K4 may be simultaneously turned on and off.

In some embodiments, the first to the fourth switch elements may be switch elements commonly used in the art, such as MOS transistors, but the present disclosure is not limited thereto. Each switch element may be a simple MOS switch formed by one transistor or a switch module formed by a plurality of transistors. The first to the fourth switch elements may be a combination of simple MOS switches and switch modules.

In some embodiments, each sense amplifier has a group of the first to the fourth switch elements K1-K4. In some other embodiments, a plurality of sense amplifiers may share a group of the first to the fourth switch elements K1-K4. For example, the first power supply nodes PCS1 of a plurality of sense amplifiers are connected to the same first switch element K1, the second power supply nodes PCS2 of the plurality of sense amplifiers are connected to the same second switch element K2, the third power supply nodes of the plurality of sense amplifiers are connected to the same third switch element K3, and the fourth power supply nodes NCS2 of the plurality of sense amplifiers are connected to the same fourth switch element K4. Therefore, the area can be reduced.

Taking FIG. 3 as an example, the first transistor M1 and the second transistor M2 may be PMOS transistors, and the third transistor M3 and the fourth transistor M4 may be NMOS transistors. The first switch element K1 and the second switch element K2 are PMOS transistors, and the third switch element K3 and the fourth switch element K4 are NMOS transistors.

In the embodiment of FIG. 3, the first switch element K1 and the second switch element K2 are connected to the same first power supply voltage VARY, and the third switch element K3 and the fourth switch element K4 are connected to the same second power supply voltage VSS. It should be understood that, in some other embodiments, the first switch element K1 may be connected to the first power supply voltage VARY1, and the second switch element K2 may be connected to another first power supply voltage VARY2 different from the first power supply voltage VARY1. The third switch element K3 may be connected to the second power supply voltage VSS1, and the fourth switch element K4 may be connected to another second power supply voltage VSS2 different from the second power supply voltage VSS1.

Figure 4:
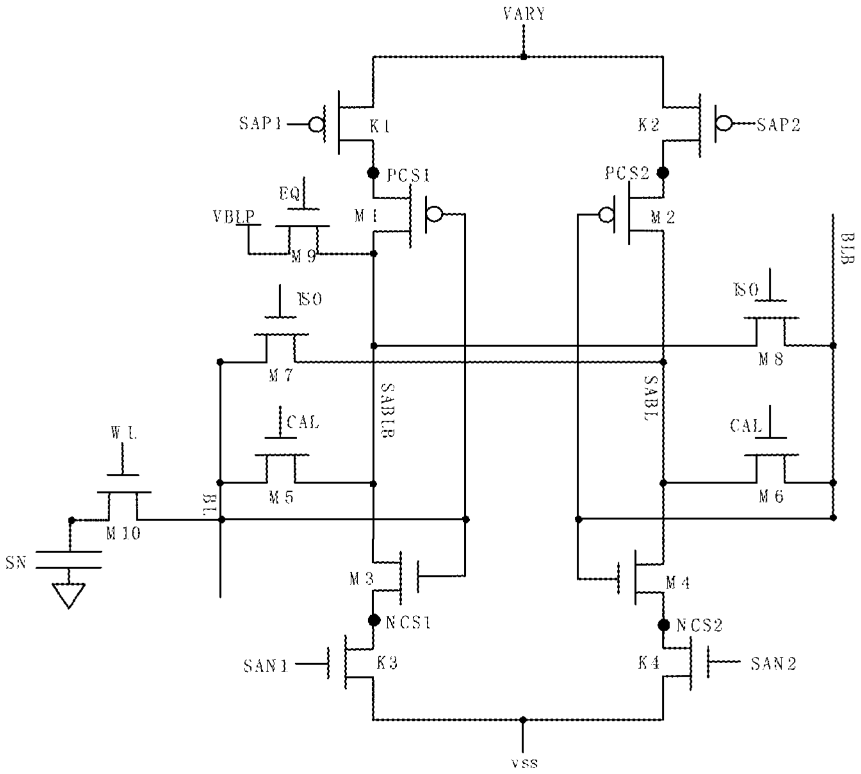
FIG. 4 is a schematic diagram of a circuit structure of another sense amplifier provided according to an embodiment of the present application.

In some embodiments, as shown in FIG. 4, the sense amplifier further includes: a second calibration transistor M6 connected between the readout bit line SABL and the control end of the fourth transistor; a first isolation transistor M7 connected between the bit line BL and the readout bit line SABL; and a second isolation transistor M8 connected between the complementary bit line BLB and the complementary readout bit line SABLB.

It should be noted that the embodiments of the present application may be combined with each other if without conflict. For example, additional designs compatible with the embodiment in FIG. 3 may also be applied in the embodiment shown in FIG. 4.

The second calibration transistor M6 is disposed between the readout bit line SABL and the control end of the fourth transistor, that is, between the input end and the output end of the second inverter formed by the second transistor M2 and the fourth transistor M4, such that the second inverter may also be allowed to invert and amplify the shared charge received by the input end by using the switching point thereof and then output the shared charge through the output end.

The first isolation transistor M7 is connected between the bit line BL and the readout bit line SABL with the gate receiving an isolation signal; the second isolation transistor M8 is connected between the complementary bit line BLB and the complementary readout bit line SABLB. In some embodiments, the gate of the first isolation transistor M7 receives the isolation signal, and one of the source and the drain is connected to the bit line BL and the other is connected to the readout bit line SABL; the gate of the second isolation transistor M8 receives the isolation signal, and one of the source and the drain is connected to the complementary bit line BLB and the other is connected to the complementary readout bit line SABLB. The arrangement of the first isolation transistor M7 and the second isolation transistor M8 may enable controlling, through isolation signals, whether the bit line and the readout bit line, and the complementary bit line and the complementary readout bit line are shorted.

In some embodiments, the gate of the second calibration transistor M6 receives the calibration signal CAL, and one of the source and the drain is connected to the readout bit line SABL and the other is connected to the complementary bit line BL. The second calibration transistor M6 may enable the sense amplifier to be applicable to the situation where the complementary bit line BLB shares the charge with the memory cell. The second inverter input/output ends formed by the second transistor M2 and the fourth transistor M4 may be shorted through the second calibration transistor M6, and this circuit enables the second inverter to be turned on at a certain phase during the operation of the sense amplifier to perform a calibration operation to calibrate the voltages of the input and output ends to the switching point thereof. In conjunction with the transfer curve of the inverter, the voltage where the input voltage Vin is equal to the output voltage Vout is the switching point voltage of the inverter. If the voltage of the input end of the second inverter is slightly changed due to the charge sharing operation performed by the complementary bit line BLB and the memory cell after the calibration operation, the voltage of the output end of the second inverter will be inverted and amplified according to the transfer curve of the inverter, resulting in a relatively significant voltage change. Therefore, in the subsequent operation process, the voltage difference base to be amplified by the sense amplifier is increased and the sensing margin is increased, thereby increasing the success rate of sensing amplification.

In some embodiments, the first calibration transistor M5 may also receive the calibration signal CAL through the gate. Based on this design, the gates of the first calibration transistor M5 and the second calibration transistor M6 receive the same control signal, which can reduce wires and wiring lanes for the calibration signal CAL and thereby reduce the wiring complexity and the chip area.

With further reference to FIG. 4, in some embodiments, a pre-charge element may be provided in the sense amplifier to pre-charge the bit line BL, the complementary bit line BLB, the readout bit line SABL, and the complementary readout bit line SABLB to a preset voltage in the pre-charge phase, such as a pre-charge power supply voltage VBLP. As shown in FIG. 4, the pre-charge element may include a pre-charge transistor M9, The control end of the pre-charge transistor receives a pre-charge signal EQ, and one end of the source and the drain is connected to a pre-charge voltage VBLP and the other end is connected to the complementary readout bit line SABLB, the readout bit line SABL, the bit line BL, or the complementary bit line BLB.

It should be understood that, in some other embodiments, the pre-charge element may also include a solution of multiple transistors such as two pre-charge transistors and three pre-charge transistors. For example, the pre-charge element may include two pre-charge transistors, where one is connected between the readout bit line SABL and the complementary readout bit line SABLB and the control end receives an equalization signal that may be the same as or different from the pre-charge signal, and the other is connected between the pre-charge power supply voltage VBLP and the complementary readout bit line SABLB or the readout bit line SABL and the control end receives a pre-charge signal. The present disclosure is not limited thereto as long as the pre-charge function can be realized.

In some embodiments, the first transistor and the third transistor form the first inverter, and the switching point voltage of the first inverter is the same as the pre-charge power supply voltage VBLP. The switching point voltage of the first inverter may be adjusted by the designing of the threshold voltages and the width-to-length ratios of the first transistor and the third transistor, such that the switching point voltage of the first inverter is the same as the pre-charge power supply voltage VBLP. Based on this, if the calibration operation of the first inverter is performed after pre-charging, the inverter may quickly reach the switching point after pre-charging, shortening the calibration time and reducing the current consumed by the sense amplifier.

Similarly, the second transistor and the fourth transistor form the second inverter, and the switching point voltage of the second inverter may also be the same as the pre-charge power supply voltage VBLP. The switching point voltage of the second inverter may be adjusted by the designing of the threshold voltages and the width-to-length ratios of the second transistor and the fourth transistor, such that the switching point voltage of the second inverter is the same as the pre-charge power supply voltage VBLP. Based on this, if the calibration operation of the second inverter is performed after pre-charging, the inverter may quickly reach the switching point after pre-charging, shortening the calibration time and reducing the current consumed by the sense amplifier.

Figure 5:
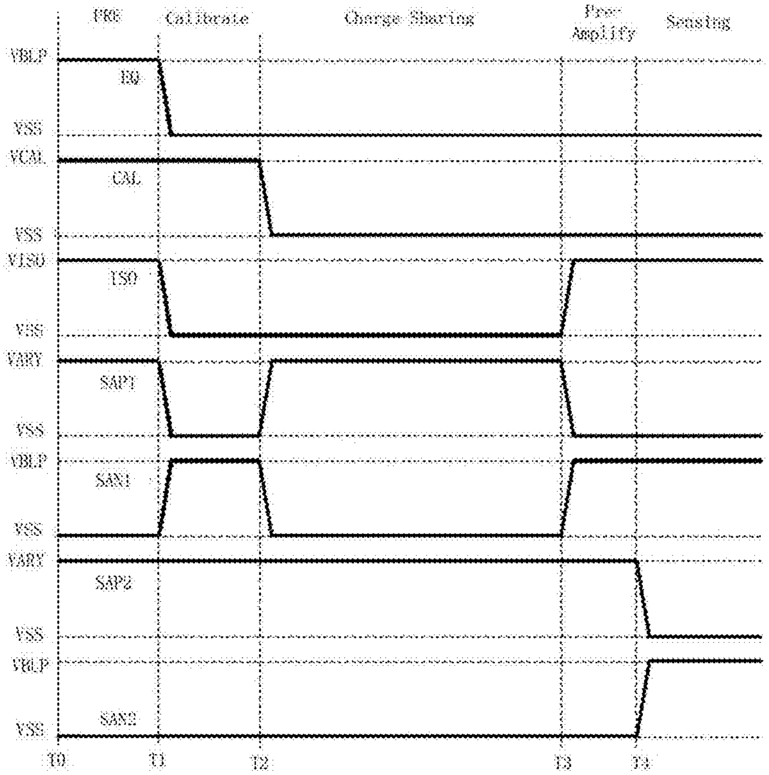
FIG. 5 is a timing diagram of a sense amplifier provided according to an embodiment of the present application.

In some embodiments, the sense amplifier of FIG. 3 or FIG. 4 may employ the operation method shown in FIG. 5. The operation method includes:

In step S1, a pre-charging operation is performed to pre-charge the bit line BL, the readout bit line SABL, the complementary bit line BLB, and the complementary readout bit line SABLB to a preset voltage VBLP.

Specifically, at time T0, the pre-charge signal EQ is set to a high level to turn on the pre-charge element, and at the same time, the calibration signal CAL and the isolation signal ISO are set to a high level to turn on all calibration transistors and isolation transistors, and the first switch signal SAP1 and the second switch signal SAP2 are set to a high level and the third switch signal SAN1 and the fourth switch signal SAN2 are set to a low level to turn off the first to fourth switch elements. Therefore, during the period of T0-T1, the bit line BL, the readout bit line SABL, the complementary bit line BLB, and the complementary readout bit line SABLB are pre-charged to the preset voltage VBLP through the pre-charge element.

In step S2, a calibration operation is performed to calibrate the voltages of the input end and the output end of the inverter formed by the first transistor and the third transistor to the same voltage.

Specifically, at time T1, the pre-charge element and all the isolation transistors are turned off, and at the same time, the calibration signal CAL is kept at a high level, and the first switch signal SAP1 is set to a low level, the third switch signal SAN1 is set to a high level, the second switch signal SAP2 is kept at a high level, and the fourth switch signal SAN2 is kept at a low level, and thus, the first calibration transistor M5 is turned on, the first and third switch elements K1 and K3 are turned on, and the second and fourth switch elements K2 and K4 are turned off. Therefore, at time T1, the first inverter composed of the first transistor M1 and the third transistor M3 is turned on, and the input end and the output end are connected through the first calibration transistor M5, such that during the period of T1-T2, through the self-adjustment of the inverter, the voltages of the input end and the output end of the inverter formed by the first transistor and the third transistor are calibrated to the same switching point voltage. Meanwhile, the second inverter formed by the second transistor M2 and the fourth transistor M4 is turned off, such that extra current is prevented from flowing through the second inverter, thereby avoiding calibration errors and waste of power.

Those skilled in the art should know that, for a PMOS transistor, when the input signal at the control end thereof is a low-level signal, the PMOS transistor is turned on, and when the input signal at the control end thereof is a high-level signal, the PMOS transistor is turned off. For an NMOS transistor, when the input signal at the control end thereof is a high-level signal, the NMOS transistor is turned on, and when the input signal of the control end thereof is a low-level signal, the NMOS transistor is turned off.

In step S3, a charge sharing operation is performed to enable the memory cell to share charge with the bit line BL.

Specifically, at time T2, the first switch signal SAP1 is set to a high level and the third switch signal SAN1 is set to a low level to turn off the first inverter, and at the same time, the calibration signal CAL is set to a low level to turn off the first calibration transistor M5 and all isolation transistors and the second inverter are kept turned off. At this time, the word line WL is set to a high level, the transistor M10 of the memory cell is turned on, and the bit line shares charge with the storage capacitor SN of the memory cell. After the charge sharing phase is finished, the word line WL is set to a low level to turn off the transistor M10 of the memory cell. After the charge sharing, the voltage of the bit line BL changes.

In step S4, a pre-amplifying operation is performed to transmit the voltage of the input end of the inverter formed by the first transistor and the third transistor to the complementary bit line BLB.

Specifically, at time T3, the word line is turned off, and the first isolation transistor M7, the second isolation transistor M8, the first calibration transistor M5, the first switch element K1, and the third switch element K3 are turned on. Therefore, the first inverter is turned on, and the voltage of the bit line BL at the input end of the first inverter is inverted and amplified by the first inverter, output to the second isolation transistor M8 through the output end, and then transmitted to the complementary bit line BLB. Based on the transfer curve of the inverter, the slight voltage change on the bit line is inverted and amplified and then output to the output end, and finally transmitted to the complementary bit line BLB, such that the voltage change is pre-amplified, and a large enough voltage difference is provided for subsequent sense amplifying.

In other embodiments, if the sharing is performed between the complementary bit line BLB and the corresponding memory cell in step S3, the second inverter formed by the second transistor and the fourth transistor and the second calibration transistor M6 are correspondingly turned on in steps S2 and S4, and the voltage change on the complementary bit line BLB is inverted and amplified by the second inverter and then transmitted to the bit line BL.

In step S5, a sense amplifying operation is performed to amplify the voltage difference between the bit line and the complementary bit line.

Specifically, at time T4, all the isolation transistors and the first inverter are kept turned on, the second inverter is turned on, and all the calibration transistors are kept turned off, such that the first inverter and the second inverter form a cross-coupled amplifier to sense-amplify the pre-amplified voltage in step S5. Due to the operations in the foregoing steps, before the sense amplifying operation, the voltage difference between the bit line BL and the complementary bit line BLB of the sense amplifier is increased and the sensing base and the sensing margin are increased, thereby increasing the success rate of the sense amplifying.

In other embodiments, on the premise of not causing erroneous operations, the switching of the transistors in all the above steps may include pre-turning on and pre-turning off.

In some embodiments, the step S5 may be followed by step S6, a write-back operation. In this operation, the data read out from the bit line is written back to the memory cell.

Figure 6:
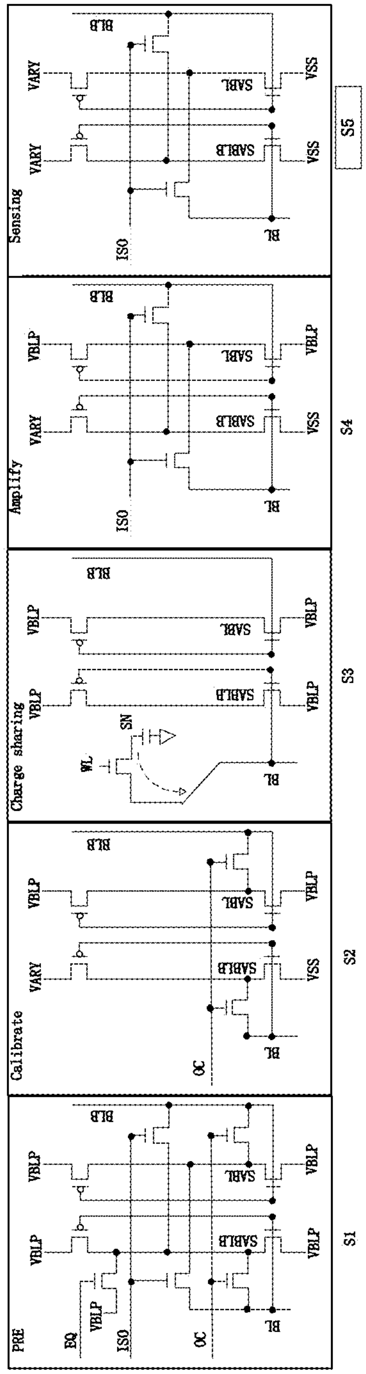
FIG. 6 is a schematic diagram of a circuit structure of a sense amplifier in various operation phases provided according to an embodiment of the present application.
Figure 7:
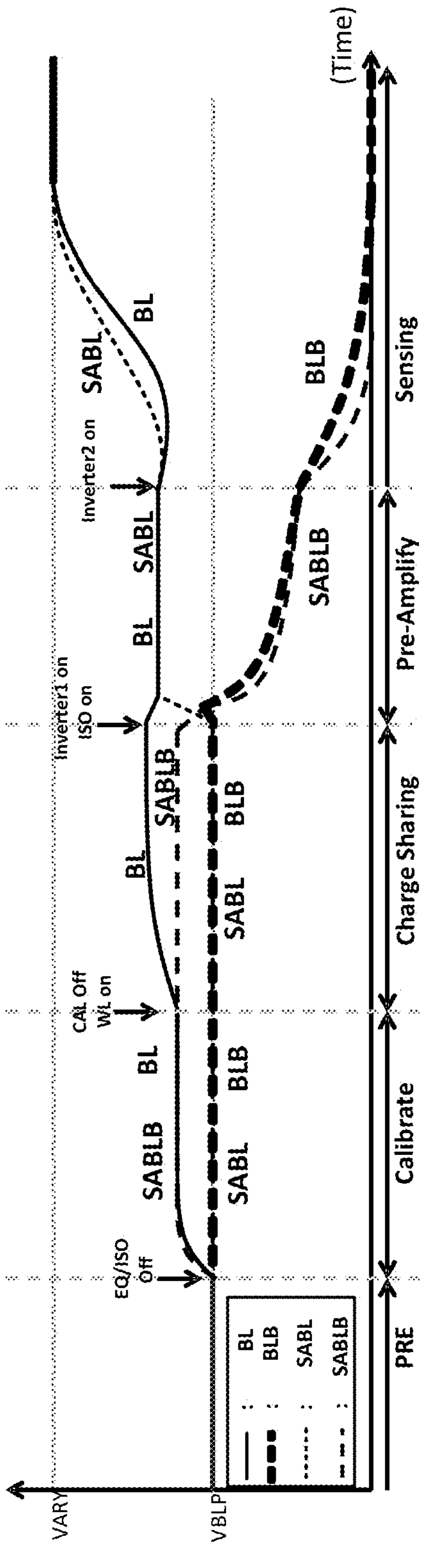
FIG. 7 is a schematic diagram illustrating voltage changes of a sense amplifier in various operation phases provided according to an embodiment of the present application.

FIG. 6 illustrates a circuit diagram of signals for operations corresponding to the operation phases in FIG. 5. FIG. 7 shows voltage changes on the bit line BL, the complementary bit line BLB, the readout bit line SABL, and the complementary readout bit line SABLB when the bit line BL is used for charge sharing and the data stored in the memory cell connected to the bit line BL is "1".

With reference to FIGS. 5, 6, and 7, in the pre-charge phase of S1, the sense amplifier is pre-charged, and the voltages of the bit line BL, the complementary bit line BLB, the readout bit line SABL, and the complementary readout bit line SABLB are all pre-charged to VBLP.

In the calibration phase of S2, the power supply of the first inverter connected to BL is turned on, and the input end and the output end of the first inverter are shorted, and thus, the input voltage Vin and the output voltage Vout of the first inverter are equal, and as shown in FIG. 7, the voltages of the bit line BL and the complementary readout bit line SABLB are stabilized at the switching point.

In the charge sharing phase of S3, the first inverter and the second inverter are not turned on, the bit line BL shares charge with the memory cell, the voltage on the bit line BL is raised, the voltage on the complementary readout bit line SABLB is kept at the switching point voltage, and the voltages on the readout bit line SABL and the complementary bit line BLB remain unchanged.

In the pre-amplify phase of S4, the first inverter Inverter1 is turned on, and the voltage on the bit line BL as the input of the first inverter is reversed and amplified to the output end of the first inverter due to the transfer curve of the inverter, such that the voltage on the complementary readout bit line SABLB rapidly decreases and the decreasing amount is greater than the rising amount of the voltage of the bit line BL. Since all isolation transistors are turned on, the bit line BL and the readout bit line SABL reach the same potential, and the complementary bit line BLB and the complementary readout bit line SABLB reach the same potential.

In the sense amplifying phase of S5, the first inverter Inverter1 and the second inverter Inverter2 are turned on to form an end-to-end cross-coupled structure, and the voltage differences on the bit line BL, the complementary bit line BLB, the readout bit line SABL, and the complementary readout bit line SABLB are further amplified and finally stabilized as data "0" and "1".

With the circuit structure and the operation method, since the first inverter and the second inverter may be independently controlled to be turned on and off and the input/output ends of the first inverter may be shorted through the first calibration transistor M5, this circuit enables the first inverter to be turned on at the calibration phase during the operation of the sense amplifier to perform a calibration operation to calibrate the voltages of the input and output ends to the switching point thereof. If the voltage of the input end of the first inverter is slightly changed due to the charge sharing operation of the sense amplifier after the calibration operation, the voltage of the output end of the first inverter will be inverted and amplified according to the transfer curve of the inverter, resulting in a relatively significant voltage change. Therefore, in the subsequent operation process, the voltage difference base to be amplified by the sense amplifier is increased and the sensing margin is increased, thereby increasing the success rate of sensing amplification.

The present application also provides an operation method for a sense amplifier. The operation method can be applied to the circuit structure shown in FIG. 8. It should be noted that, if compatible, the same and similar product designs may also be utilized in the embodiment of FIG. 8 as those in the previous embodiments, or the operation method for the sense amplifier may also be directly applied to the products in the previous embodiments.

In this embodiment, the operation method for a sense amplifier is used for operating a sense amplifier including a first inverter INV1 and a second inverter INV2 cross-coupled with each other, where the input end of the first inverter is connected to the bit line and the input end of the second inverter is connected to the complementary bit line. The operation method includes:

- performing a pre-charging operation to pre-charge all internal nodes of the sense amplifier to a preset voltage;
- performing a calibration operation to calibrate voltages of the input end and an output end of the first inverter to the same voltage;
- performing a charge sharing operation to enable a memory cell to share charge with the bit line;

performing a pre-amplifying operation to enable the voltage of the input end of the first inverter to be pre-amplified and transmitted to the complementary bit line; and performing a sense amplifying operation to amplify a voltage difference between the bit line and the complementary bit line.

According to the above method, in the calibration phase, after the voltages of the input end and the output end of the inverter are calibrated to the same voltage and a pre-amplifying operation is added after the charge sharing is finished. Since the input end of the inverter is connected to the bit line, the voltage change of the bit line may lead to the same voltage change at the input end of the first inverter. According to the transfer curve of the inverter, the slight voltage change of the input end may be reflected in the output end in an inverted and amplified manner. Therefore, the first inverter may reverse and amplify the minute voltage of the charge sharing to obtain the amplified charge sharing voltage value, thereby providing a better amplification base for the sense amplification in the sense amplifying phase, increasing the sensing margin, reducing the probability of errors in reading and writing data by the sense amplifier, and improving the reliability of the memory.

Figure 8:
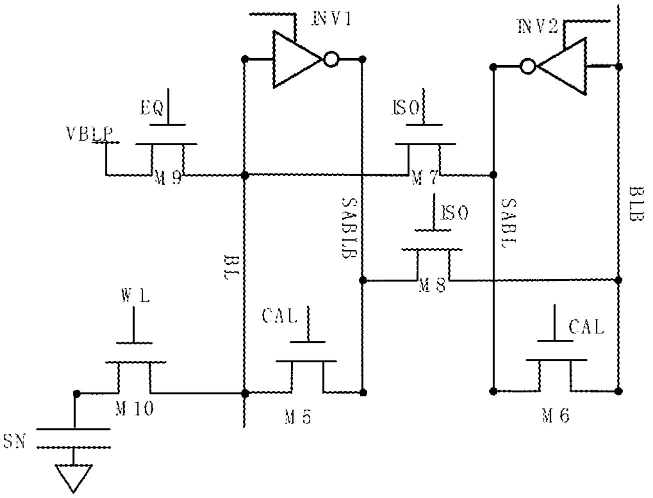
FIG. 8 is a schematic diagram of a circuit structure of still another sense amplifier provided according to an embodiment of the present application.

In FIG. 8, a first inverter INV1 and a second inverter INV2 are shown. The first inverter INV1 and the second inverter INV2 may be gated inverters, and the on and off of gated inverters are controlled by control signals. In addition, the number of the PMOS and NMOS transistor pairs in the inverter is not limited in this embodiment, and the PMOS and NMOS transistor pairs of the first inverter INV1 and the second inverter INV2 may be only one pair of PMOS and NMOS transistors, as in the foregoing embodiments, or may be multiple pairs of PMOS and NMOS transistors.

A case where the first inverter INV1 and the second inverter INV2 are cross-coupled is shown in FIG. 8. Cross-coupling of the first inverter and the second inverter refers to the connection of the output ends of the two inverters to each other's the input ends, creating a circuit structure characterized by mutual feedback. A bistable circuit may be formed in this cross-coupling manner. In the example of FIG. 8, the input end of the first inverter INV1 is connected to the output end of the second inverter INV2 through the first isolation transistor M7, and the input end of the second inverter INV2 is connected to the output end of the first inverter INV1 through the second isolation transistor M8.

Specifically, when the pre-charging operation is performed, the internal nodes for pre-charging may include a bit line BL, a complementary bit line BLB, a readout bit line SABL, and a complementary readout bit line SABLB, and the preset voltage for pre-charging may include a pre-charge voltage VBLP.

Specifically, the sense amplifier includes the first calibration transistor M5 electrically connected between the input end and the output end of the first inverter INV1. When the calibration operation is performed, the first inverter INV1 is turned on by the control signal of the gated inverter, and at the same time, the first calibration transistor M5 is turned on to calibrate the voltages of the input end and the output end of the first inverter INV1 to the same voltage.

In some embodiments, the sense amplifier includes the first isolation transistor M7 connected between the input end of the first inverter and the output end of the second inverter and the second isolation transistor M8 connected between the output end of the first inverter and the input end of the second inverter. When the pre-amplifying operation is performed, since the input end of the first inverter INV1 is connected to the bit line BL, the voltage of the input end of the first inverter INV1 changes in the same manner as the bit line BL after the bit line BL shares charge with the memory cell in the charge sharing phase. Therefore, the pre-amplifying operation phase may pre-amplify the voltage of the input end of the first inverter INV1 (i.e., the voltage on the bit line BL), and then the voltage of the input end of the first inverter may be pre-amplified and transmitted to the complementary bit line BLB through the turned-on first isolation transistor M7 and the turned-on second isolation transistor M8. When the sense amplifying operation is performed, the control signal of the gated inverter enables to turn on the first inverter INV1 and the second inverter INV2, and the voltage difference between the bit line BL and the complementary bit line BLB is amplified.

In some embodiments, the present application also provides a memory. The memory includes a plurality of sense amplifiers as described in any one of the foregoing embodiments. In addition, the memory also includes a plurality of memory cells. The sense amplifiers are connected to the memory cells through bit lines BLs. It can be understood that, in the single-ended sense amplifier, the sense amplifier is connected to the memory cell only through the bit line BL and performs charge sensing and amplification. In the double-ended sense amplifier, the sense amplifier is also connected to another memory cell through a complementary bit line BLB and performs amplification by amplifying the voltage difference between the bit line BL and the complementary bit line BLB.

Those of ordinary skill in the art can understand that the foregoing implementations are specific embodiments of practicing the present application, while in practical applications, various changes can be made to the implementations in form and detail without departing from the spirit and scope of the present application. Any person skilled in the art can make respective changes and modifications without departing from the spirit and scope of the present application, and the protection scope of the present application is defined by the appended claims.

What is claimed is:

1. A sense amplifier, comprising:

a first transistor electrically connected between a first power supply node and a complementary readout bit line, a control end of the first transistor being connected to a control end of a third transistor;

a second transistor electrically connected between a second power supply node and a readout bit line, a control end of the second transistor being connected to a control end of a fourth transistor;

the third transistor electrically connected between the complementary readout bit line and a third power supply node;

the fourth transistor electrically connected between the readout bit line and a fourth power supply node; and a first calibration transistor connected between the complementary readout bit line and the control end of the third transistor, wherein the first power supply node is connected to a first power supply voltage through a first switch element; the second power supply node is connected to the first power supply voltage through a second switch element;

the third power supply node is connected to a second power supply voltage through a third switch element; the fourth power supply node is connected to the second power supply voltage through a fourth switch element.

2. The sense amplifier according to claim 1, further comprising:

a second calibration transistor connected between the readout bit line and the control end of the fourth transistor;

a first isolation transistor connected between a bit line and the readout bit line; and a second isolation transistor connected between a complementary bit line and the complementary readout bit line.

3. The sense amplifier according to claim 1, further comprising: a pre-charge element, the pre-charge element being configured to pre-charge the bit line, the readout bit line, the complementary bit line, and the complementary readout bit line to a preset voltage, wherein the first transistor and the third transistor form a first inverter, and a switching point voltage of the first inverter is the same as the preset voltage.

4. A memory, comprising: a plurality of sense amplifiers according to claim 1 and a plurality of memory cells, wherein the plurality of sense amplifiers are connected to the plurality of memory cells through bit lines.

5. An operation method for a sense amplifier, used for operating a sense amplifier comprising:

a first transistor electrically connected between a first power supply node and a complementary readout bit line, a control end of the first transistor being connected to a control end of a third transistor;

a second transistor electrically connected between a second power supply node and a readout bit line, a control end of the second transistor being connected to a control end of a fourth transistor;

the third transistor electrically connected between the complementary readout bit line and a third power supply node;

the fourth transistor electrically connected between the readout bit line and a fourth power supply node;

a first calibration transistor connected between the complementary readout bit line and the control end of the third transistor, wherein the first power supply node is connected to a first power supply voltage through a first switch element; the second power supply node is connected to the first power supply voltage through a second switch element, the third power supply node is connected to a second power supply voltage through a third switch element; the fourth power supply node is connected to the second power supply voltage through a fourth switch element;

a second calibration transistor connected between the readout bit line and the control end of the fourth transistor;

a first isolation transistor connected between a bit line and the readout bit line; and a second isolation transistor connected between a complementary bit line and the complementary readout bit line;

the operation method comprising:

performing a pre-charging operation to pre-charge the bit line, the readout bit line, the complementary bit line, and the complementary readout bit line to a preset voltage;

performing a calibration operation to calibrate voltages of an input end and an output end of an inverter formed by the first transistor and the third transistor to the same voltage;

performing a charge sharing operation to enable a memory cell to share charge with the bit line;

performing a pre-amplifying operation to transmit the voltage of the input end of the inverter formed by the first transistor and the third transistor to the complementary bit line; and performing a sense amplifying operation to amplify a voltage difference between the bit line and the complementary bit line.

6. The operation method according to claim 5, wherein performing the calibration operation comprises: turning on the first calibration transistor, the first switch element, and the third switch element to calibrate the voltages of the input end and the output end of the inverter formed by the first transistor and the third transistor to the same voltage.

7. The operation method according to claim 5, wherein performing the pre-amplifying operation comprises: turning on the first isolation transistor, the second isolation transistor, the first switch element, and the third switch element to enable the voltage of the input end of the inverter formed by the first transistor and the third transistor to be pre-amplified and transmitted to the complementary bit line.

8. An operation method for a sense amplifier, used for operating a sense amplifier comprising a first inverter and a second inverter cross-coupled with each other, an input end of the first inverter being connected to a bit line and an input end of the second inverter being connected to a complementary bit line, the operation method comprising:

performing a pre-charging operation to pre-charge all internal nodes of the sense amplifier to a preset voltage;

performing a calibration operation to calibrate voltages of the input end and an output end of the first inverter to the same voltage;

performing a charge sharing operation to enable a memory cell to share charge with the bit line;

performing a pre-amplifying operation to enable the voltage of the input end of the first inverter to be pre-amplified and transmitted to the complementary bit line; and performing a sense amplifying operation to amplify a voltage difference between the bit line and the complementary bit line.

9. The operation method according to claim 8, wherein the sense amplifier comprises: a first calibration transistor electrically connected between the input end and the output end of the first inverter, and performing the calibration operation comprises: turning on the first calibration transistor and allowing the first inverter to be powered on to calibrate the voltages of the input end and the output end of the first inverter to the same voltage.

10. The operation method according to claim 9, wherein the sense amplifier comprises: a first isolation transistor connected between the input end of the first inverter and an output end of the second inverter and a second isolation transistor connected between the output end of the first inverter and the input end of the second inverter, and performing the pre-amplifying operation comprises: turning on the first isolation transistor, the second isolation transistor, and the first calibration transistor and allowing the first inverter to be powered on to enable the voltage of the input end of the first inverter to be pre-amplified and transmitted to the complementary bit line.

* * * * *